(12) United States Patent
Jeon

(10) Patent No.: US 11,647,615 B2
(45) Date of Patent: May 9, 2023

(54) ELECTRONIC DEVICE PACKAGE AND MANUFACTURING METHOD THEREOF

(71) Applicant: SAMSUNG ELECTRO-MECHANICS CO., LTD., Suwon-si (KR)

(72) Inventor: Young Ho Jeon, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 17/028,060

(22) Filed: Sep. 22, 2020

(65) Prior Publication Data

US 2022/0007554 A1   Jan. 6, 2022

(30) Foreign Application Priority Data

Jul. 1, 2020 (KR) .................. 10-2020-0081016

(51) Int. Cl.
| | | |
|---|---|---|
| *H05K 9/00* | (2006.01) | |
| *H01L 23/552* | (2006.01) | |
| *H01L 23/13* | (2006.01) | |
| *H05K 1/02* | (2006.01) | |
| *H01L 21/56* | (2006.01) | |
| *H05K 1/18* | (2006.01) | |

(52) U.S. Cl.
CPC ............ *H05K 9/0022* (2013.01); *H01L 21/56* (2013.01); *H01L 23/13* (2013.01); *H01L 23/552* (2013.01); *H05K 1/0284* (2013.01); *H05K 1/181* (2013.01); *H05K 2201/09036* (2013.01); *H05K 2201/09972* (2013.01)

(58) Field of Classification Search
CPC .......... H05K 1/02; H05K 1/0284; H05K 1/18; H05K 1/181–187; H05K 9/0022; H01L 23/48; H01L 23/552; H01L 21/50; H01L 21/78
USPC ................ 361/760, 764, 792–795, 816, 818; 174/520; 257/659–690, 787–790
See application file for complete search history.

(56) References Cited

U.S. PATENT DOCUMENTS

| | | | | |
|---|---|---|---|---|
| 5,866,953 | A * | 2/1999 | Akram ................ | H01L 23/3128 257/790 |
| 7,906,371 | B2 * | 3/2011 | Kim .................... | H01L 23/3121 438/126 |
| 8,008,753 | B1 * | 8/2011 | Bolognia ............ | H01L 25/0655 257/659 |
| 10,490,512 | B2 * | 11/2019 | Kitazaki ............... | H01L 23/552 |
| 10,784,210 | B2 * | 9/2020 | Kim ...................... | H01L 23/28 |
| 2009/0294930 | A1 | 12/2009 | Yoon et al. | |
| 2011/0115059 | A1 * | 5/2011 | Lee .................... | H01L 23/49805 257/659 |
| 2011/0115066 | A1 * | 5/2011 | Kim ..................... | H01L 21/565 257/690 |

(Continued)

FOREIGN PATENT DOCUMENTS

| | | |
|---|---|---|
| KR | 10-0877551 B1 | 1/2009 |
| KR | 10-2018-0067047 | 6/2018 |
| WO | WO 2000/14771 | 3/2000 |

*Primary Examiner* — Tuan T Dinh
(74) *Attorney, Agent, or Firm* — NSIP Law

(57) ABSTRACT

An electronic device package is disclosed. The electronic device package includes a board on which an electronic device is mounted, a molded portion formed to cover the electronic device on the board, and a conductive layer disposed on a surface of the molded portion and extended in a trench formed on the board.

19 Claims, 18 Drawing Sheets

(56) References Cited

U.S. PATENT DOCUMENTS

| | | | |
|---|---|---|---|
| 2012/0044653 A1* | 2/2012 | Morris | H05K 3/284 |
| | | | 361/728 |
| 2013/0037923 A1* | 2/2013 | Yoo | H01L 23/49827 |
| | | | 257/659 |
| 2016/0149300 A1* | 5/2016 | Ito | H01Q 1/526 |
| | | | 427/58 |
| 2016/0351509 A1* | 12/2016 | Dang | H01L 21/268 |
| 2017/0323838 A1* | 11/2017 | Otsubo | H01L 21/561 |
| 2017/0347462 A1* | 11/2017 | Miwa | H01L 23/552 |
| 2018/0168029 A1 | 6/2018 | Kuk et al. | |

* cited by examiner

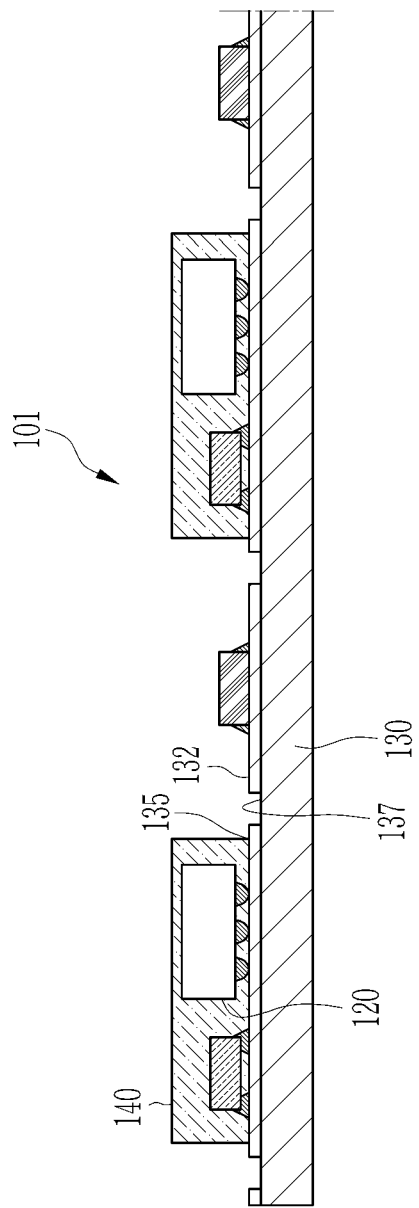

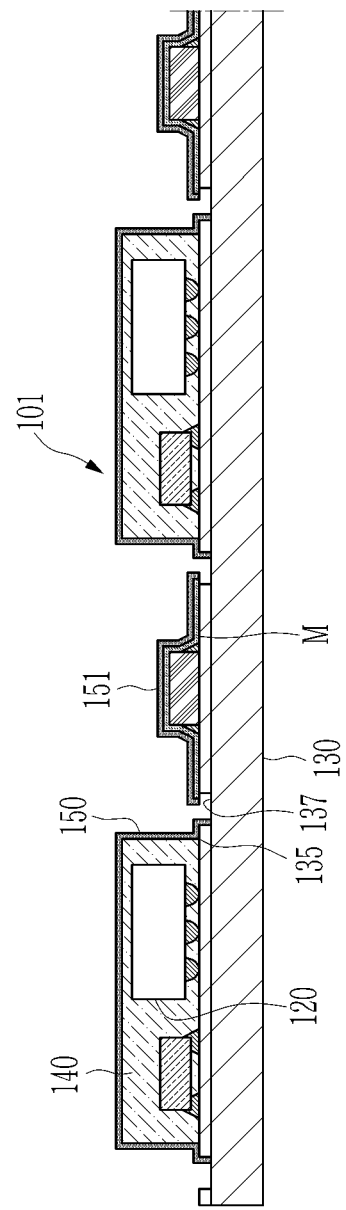

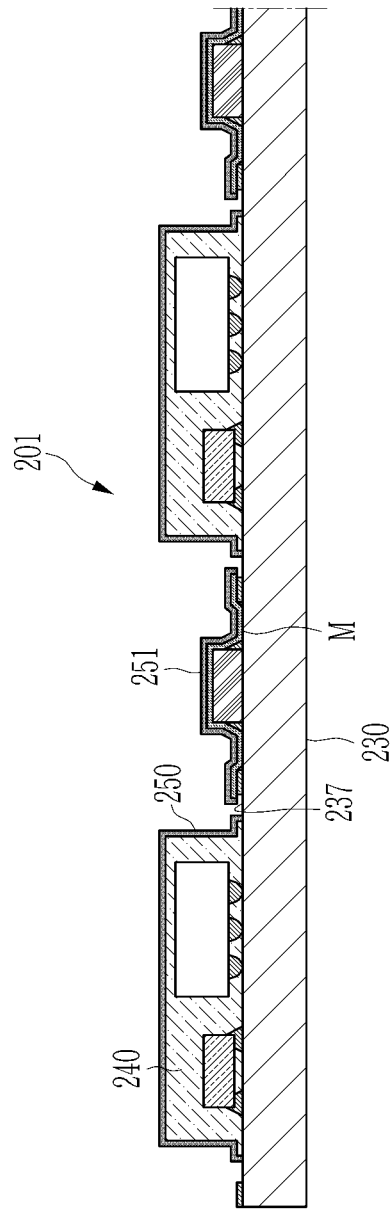

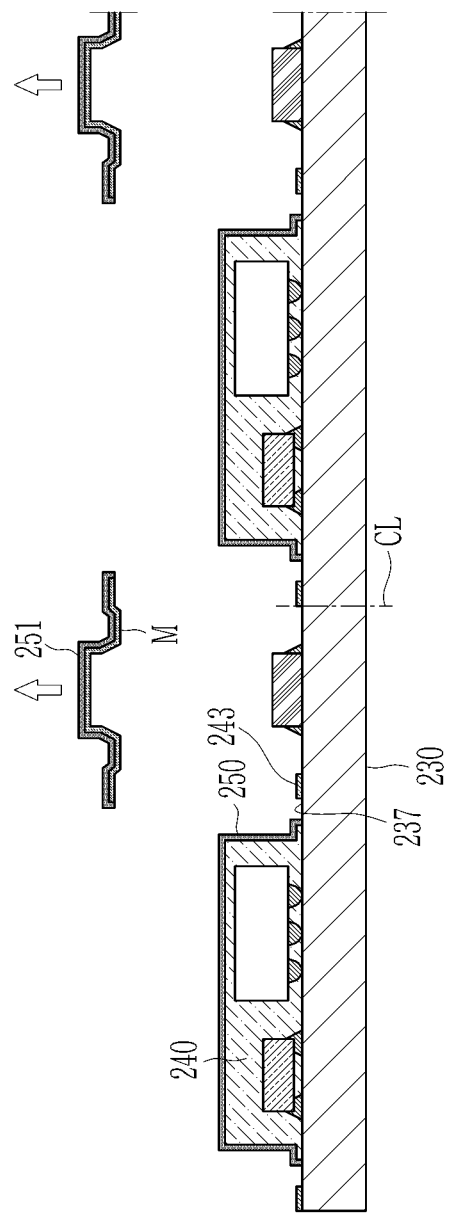

ELECTRONIC DEVICE PACKAGE AND MANUFACTURING METHOD THEREOF

CROSS-REFERENCE TO RELATED APPLICATION

This application claims the benefit under 35 USC § 119(a) of Korean Patent Application No. 10-2020-0081016, filed on Jul. 1, 2020, in the Korean Intellectual Property Office, the entire disclosure of which is incorporated herein by reference for all purposes.

BACKGROUND

1. Field

The following description relates to an electronic device package and a manufacturing method thereof.

2. Description of Related Art

With the rapid development of smart devices, there is a demand for personal and portable products in the electronic device industry. In order to enhance portability of the smart devices while simultaneously improving the functions and performance of the smart devices, down-sizing and weight reduction of electronic devices embedded in these device systems are beneficial.

In order to implement the down-sizing and weight reduction of the electronic devices, along with the technological development in the direction of reducing the individual size of the mounting components, the development of a technology that integrates a plurality of individual elements into a single electronic device has been conducted in parallel therewith. For example, a system on chip (SoC) refers to a computer or a battery system component integrated in one integrated circuit, and a system in package (SIP) refers to a technology that implements materials with a light weight and a small size as a technology that implements multiple circuits formed of separate chips into a single package.

In the SIP module applied to an electronic industry related to communication, several functions may be gradually multi-functioned into one module because the multiple functions may increasingly be beneficial. Accordingly, a problem in which interference such as electromagnetic interference (EMI) or poor electromagnetic compatibility (EMC) between the components in one module or other modules may occur. Accordingly, in order to prevent such electromagnetic interference (EMI), it may be necessary to develop a component to which a partial shield is applied.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, an electronic device package includes a board, on which an electronic device is mounted; a molded portion, formed to cover the electronic device that is mounted on the board; and a conductive layer, disposed on a surface of the molded portion, and configured to extend into a trench formed on the board.

The molded portion may be configured to contact the board to form a border, and the trench is formed adjacent to the border.

The trench may have a width that is parallel to an upper surface of the board, and the width is measured in a direction perpendicular to the border, and a depth that is measured in a thickness direction of the board, and the width of the trench is formed to be larger than the depth of the trench.

The conductive layer may be disposed to extend to a side surface of the molded portion, covers the border, and extends to contact a bottom portion of the trench.

The board may be divided into a shield layer formation region and a shield layer non-formation region, the shield layer non-formation region includes an electronic device, and the trench is disposed between the molded portion and the electronic device of the shield layer non-formation region.

The trench may be formed to surround the molded portion in a ring shape along an outer circumference of the molded portion.

The trench may be formed to extend in a straight line along an edge of the molded portion.

An end portion of the conductive layer may be disposed within the trench.

The trench may be formed by recessing an insulating protection layer formed on the upper surface of the board.

The trench may be formed by patterning a mold material on an upper surface of the board.

A first side wall of the trench may be defined by a mold bump that protrudes from the board.

The molded portion may include an extended region that extends on the board in a direction perpendicular to an edge of the molded portion, and the trench is formed by recessing an upper surface of the extended region of the molded portion.

In a general aspect, an electronic device package manufacturing method includes mounting an electronic device on a board; forming a molded portion that seals the electronic device that is mounted on the board; forming a trench on the board adjacent to the molded portion; setting a shield layer non-formation region that is distinguished from a shield layer formation region, wherein the shield layer formation region includes the molded portion; forming a masking film on the shield layer non-formation region to dispose an edge of the masking film over the trench; forming a conductive layer on the molded portion and the masking film; and removing the masking film.

The forming of the trench may include patterning an insulating protection layer formed on the upper surface of the board to form the trench.

In the forming of the trench, a mold material on an upper surface of the board may be patterned to form the trench.

In a general aspect, an electronic device package includes a board, comprising a shield layer formation region, and a shield layer non-formation region; a trench, formed on the board; wherein the shield layer formation region comprises a first electronic device which is covered by a molded portion; and a first conductive layer, disposed on the molded portion, and configured to extend into the trench; and wherein the shield layer non-formation region comprises a second electronic device, which is coated with a masking film; and a second conductive layer, disposed over the masking film, and configured to extend into the trench.

An edge of the masking film may be configured to protrude over the trench.

The trench may be formed by recessing an insulating protection layer that is formed on the board.

Other features and aspects will be apparent from the following detailed description, the drawings, and the claims.

BRIEF DESCRIPTION OF DRAWINGS

FIG. 6A to FIG. 6D illustrate processing views of a process for manufacturing an example electronic device package, in accordance with one or more embodiments illustrated in FIG. 1.

FIG. 11A to FIG. 11D illustrate processing views of an example manufacturing process for an example electronic device package, in accordance with one or more embodiments illustrated in FIG. 7.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
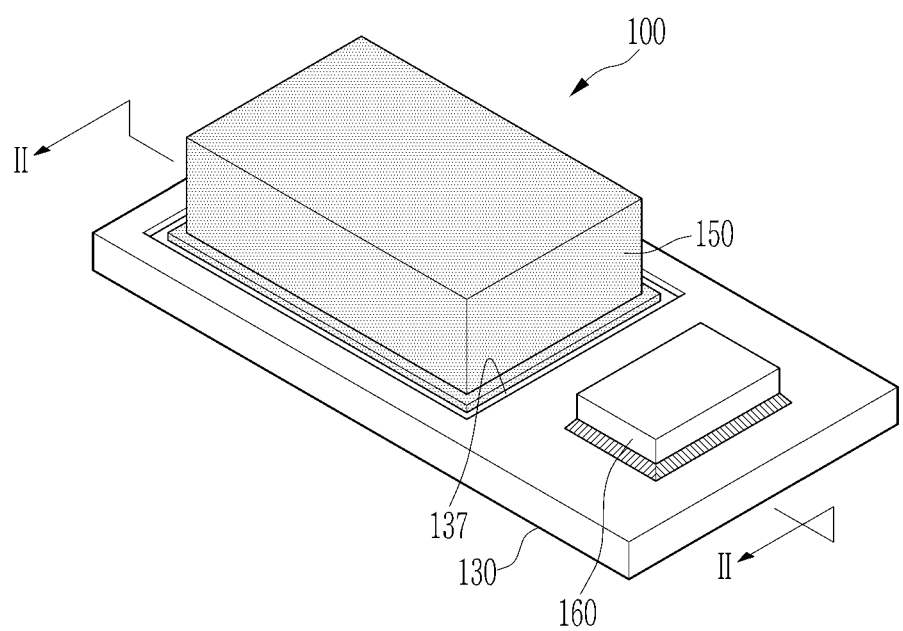
FIG. 1 is a perspective view illustrating an example electronic device package, in accordance with one or more embodiments.

Hereinafter, embodiments of the present disclosure will be described in detail with reference to the accompanying drawings, it is noted that examples are not limited to the same The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may be also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms, "includes," "comprises," "is configured to," "has," etc. of the description specify the presence of stated features, numbers, steps, operations, members, elements, parts, and/or combinations thereof, but do not preclude the presence or addition of one or more other features, numbers, steps, operations, members, elements, parts, and/or combinations thereof.

The features of the examples described herein may be combined in various ways as will be apparent after an understanding of this disclosure. Further, although the examples described herein have a variety of configurations, other configurations are possible as will be apparent after an understanding of this disclosure.

Due to manufacturing techniques and/or tolerances, variations of the shapes shown in the drawings may occur. Thus, the examples described herein are not limited to the specific shapes shown in the drawings, but include changes in shape that occur during manufacturing.

Figure 2:
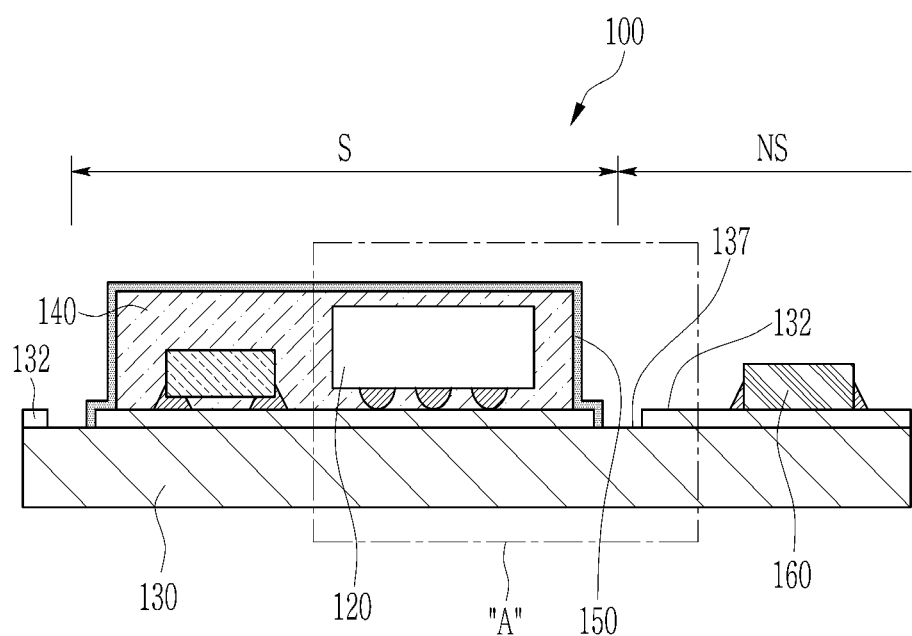
FIG. 2 illustrates a cross-sectional view of an example electronic device package taken along a line II-II in FIG. 1.
Figure 3:
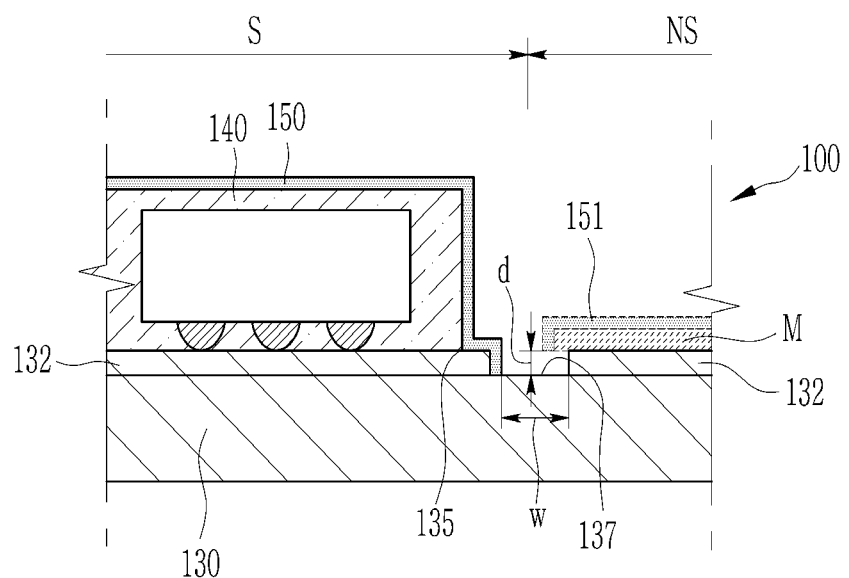
FIG. 3 illustrates an enlarged cross-sectional view of a portion "A" of FIG. 2.

FIG. 1 illustrates a perspective view of an example electronic device package, in accordance with one or more embodiments, FIG. 2 is a cross-sectional view of an example electronic device package taken along a line II-II in FIG. 1, and FIG. 3 is an enlarged cross-sectional view of a portion "A" of FIG. 2.

Referring to FIG. 1 and FIG. 2, an example electronic device package 100, in accordance with one or more embodiments, may include a board 130 on which an electronic device 120 is mounted, a molded portion 140 that covers the electronic device 120, and a conductive layer 150 disposed on the molded portion 140. The electronic device 120 may include an active element such as, as non-limiting examples, an IC (Integrated Circuit) chip or a passive element. The board 130 may be a multi-layered circuit board that may be formed by repeatedly stacking, for example, a plurality of insulation layers and a plurality of wiring layers, and may be configured as a double-sided circuit board in which a wiring layer is formed on both sides of one insulation layer as necessary.

The molded portion 140 may be formed to cover and seal the electronic device 120 in at least a part of the area on the board 130, and the molded portion 140 thus formed may be extended to cover the side of the electronic device 120 to contact the board 130, and may thereby be configured to form a border 135 (FIG. 3). In a non-limited example, the molded portion 140 may be formed by using an epoxy mold compound (EMC) as a mold material.

The conductive layer 150 may be formed on the molded portion 140 to cover the molded portion 140. The conductive layer 150 may be formed by depositing a conductive material along the surface of the molded portion 140 to function as an electromagnetic interference (EMI) shield layer, and may be deposited by, for example, a sputtering process.

In the electronic device package 100, a trench 137 may be formed on the board 130 adjacent to the molded portion 140. The trench 137 may be disposed adjacent to the border 135 formed by the meeting of the board 130 and the molded portion 140, and the conductive layer 150 may be disposed to be extended into the trench 137. That is, the conductive layer 150 extending to the side of the molded portion 140, covers the border 135 of the molded portion 140 and the board 130, then extends into the trench 137, and then may reach the bottom of the trench 137.

The trench 137 may be formed by recessing an insulating protection layer 132 formed on the upper surface of the board 130 adjacent to the border 135. The insulating protection layer 132 may be formed of a solder resist, and the trench 137 having such a shape may be patterned when processing the solder resist on the upper surface of the board 130.

Referring to FIG. 3, the trench 137 may be formed such that the width w is larger than the depth d. In an example, the width of the trench 137 may be measured in a direction (an x-axis direction or a y-axis direction in the drawing) parallel to the upper surface of the board 130 and perpendicular to the edge of the molded portion 140 or the border 135, and the depth of the trench 137 may be measured in the thickness direction (a z-axis direction in the drawing) of the board 130. Accordingly, the width w may be measured in the x-axis direction of the drawing in the portion where the trench 137 extends in the y-axis direction of the drawing, and the width w may be measured in the y-axis direction of the drawing in the portion where the trench 137 extends in the x-axis direction of the drawing.

The conductive layer 150 may be formed through a sputtering process while screening the shield layer non-formation region NS with a masking film M. In this example, by locating the edge of the masking film M to be protruded over the trench 137, a conductive layer 151, coated in the shield layer non-formation region NS, may be easily cut off from the conductive layer 150 coated in the shield layer formation region S with reference to the trench 137 when removing the masking film M. This will be described in more detail below with reference to the process diagram.

Figure 4:
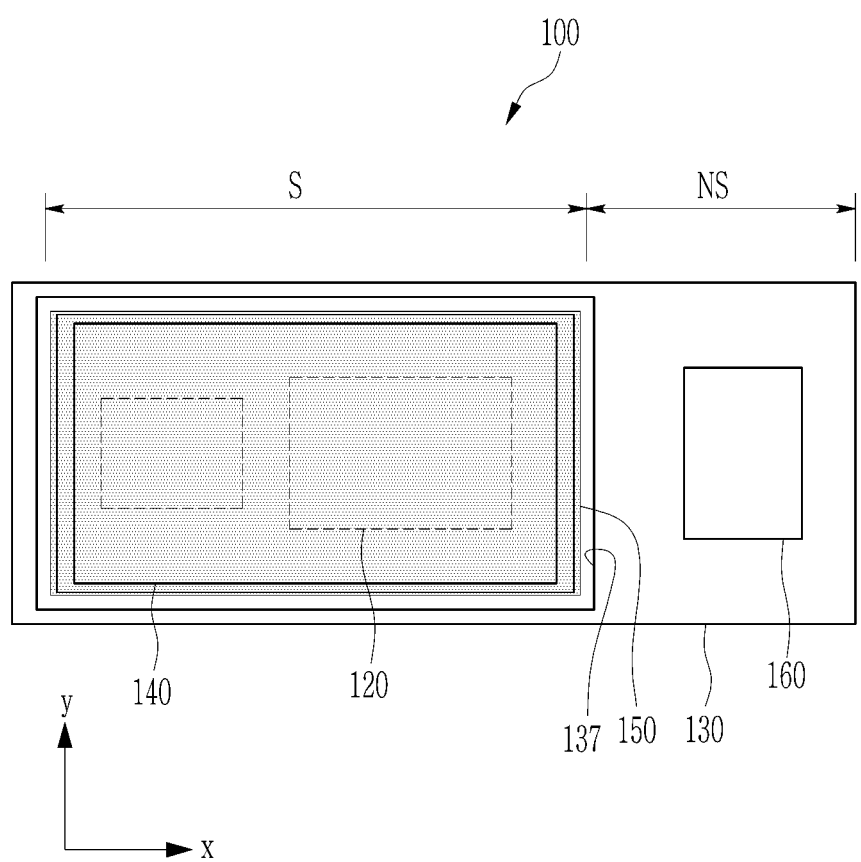
FIG. 4 illustrates a top plan view showing an example electronic device package, in accordance with one or more embodiments illustrated in FIG. 1.

FIG. 4 illustrates a top plan view of an example electronic device package, in accordance with one or more embodiments.

Referring to FIG. 4, in the electronic device package 100, the trench 137 may be formed to extend in a parallel direction along the edge of the molded portion 140, and to surround the molded portion 140 in a ring shape plane along the outer circumference thereof. Additionally, on the board 130, another electronic device 160 may be disposed on the shield layer non-formation region NS, and in an example, a connector may be mounted. Therefore, the trench 137 may be disposed between the other electronic device 160 and the molded portion 140.

In an example, the conductive layer 150 extending into the trench 137 is terminated in the trench 137 so that the end portion thereof may be disposed within the trench 137. This is because the conductive layer 150 may be cut off in the trench 137 after the masking film M that protrudes over the trench 137 is removed after the deposition of the conductive layer 150 in the forming process of the conductive layer 150. As a result, when the conductive layer 150 is deposited using the masking film M, the lifting of the conductive layer 150 that may occur on the surface of the board 130 may be prevented.

Figure 5:
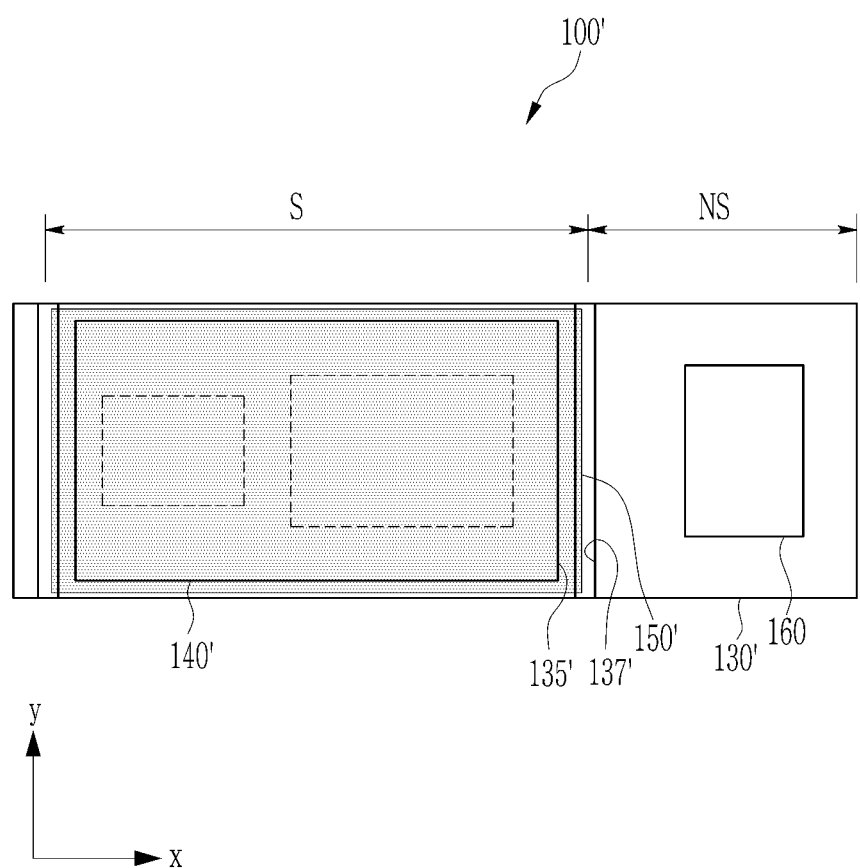
FIG. 5 illustrates a top plan view of an example variation, in accordance with one or more embodiments illustrated in FIG. 1.

FIG. 5 illustrates a top plan view of a variation in accordance with one or more embodiments shown in FIG. 1.

Referring to FIG. 5, in an electronic device package 100' according to an example, a trench 137' may extend in a straight line on a board 130' along one edge of a molded portion 140', and may extend to the edge of the board 130'. In an example, the trench 137' may be disposed at two places on two sides of the molded portion 140' adjacent to the shield layer non-formation region NS on a plane, and a conductive layer 150' may be extended into the trench 137'.

FIG. 6A to FIG. 6D are processing views illustrating a manufacturing process for an example electronic device package, in accordance with one or more embodiments shown in FIG. 1. The manufacturing method of the example electronic device package, in accordance with one or more embodiments, is described with reference to FIG. 6A to FIG. to 6D as follows. Here, the electronic device package may be manufactured by arranging a plurality of modules on a single board in a form of an array to produce an electronic device package array 101 and then cutting it into a single module package.

Referring to FIG. 6A, according to a manufacturing method of the example electronic device package, in one step, the electronic device 120 may be mounted on the board 130. The board 130 may use a printed circuit board (PCB), and the electronic device 120 may include an active element such as an IC chip or a passive element.

Referring to FIG. 6A, in another step, the molded portion 140 that seals the electronic device 120 may be formed on the board 130. The molded portion 140 may be formed to cover and seal the electronic device 120 in at least some areas on the board 130. The molded part 140 thus formed, may be extended to cover the side of the electronic device 120, and may meet or contact the board 130 to form the border 135. The molded portion 140 may use, for example, an epoxy mold compound (EMC) as a mold material.

Referring to FIG. 6A, in still another step, the trench 137 may be formed on the board 130 adjacent to the molded portion 140. The trench 137 may be patterned by processing a solder resist when forming the insulating protection layer 132 on the upper surface of the board 130, whereby the trench 137 may be formed in a structure in which the insulating protective layer 132 on the upper surface of the board 130 is recessed.

Figure 6B:
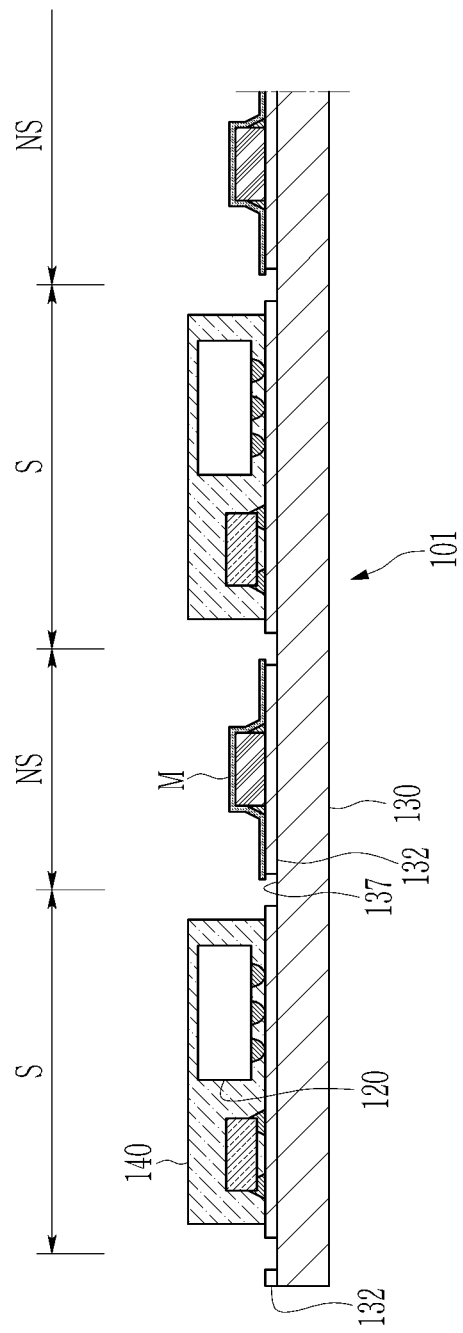

Referring to FIG. 6B, in still another step, the shield layer formation region S including the molded portion 140 and the shield layer non-formation region NS, which are other regions, are set, and a masking film M may be implemented as a cover in the shield layer non-formation region NS. At this time, one edge of the masking film M may be disposed so that it is above, or extends over, the trench 137, that is, the masking film M protrudes into the region of the trench 137.

Referring to FIG. 6C, in still another step, the conductive layers 150 and 151 may be respectively formed over the molded portion 140 and the masking film M. The conductive layer 150 may be formed by depositing a conductive material along the surface of the molded portion 140. The conductive layer 150 may be implemented as the electromagnetic interference (EMI) shield layer, and for example the sputtering process may be applied. The conductive layer 150 may be formed to cover the molded portion 140, and the conductive layer 151 may also be coated on the masking film M, but may be formed to be easily disconnected in the region of the trench 137.

That is, when the sputtering process is applied, ionized gas atoms of the conductive layer forming material may be ejected and vacuum deposited to form a thin film on the upper surface of the molded portion 140 and the masking film M as a whole. Therefore, the ionized gas atoms ejected during the sputtering process may deposit the conductive layer 150 that is connected from the top and sides of the molded portion 140, covers the border 135 of the molded portion 140 and the board 130, and extends to the interior wall of one side and the bottom of the trench 137. On the other hand, since the masking film M may be disposed so that at least one edge over the trench 137 is protruded, a space formed by the width and the depth of the trench 137 may be ensured between the edge of the masking film M and the bottom of the trench 137. While forming a step by this space, the edge of the masking film M may be hung over the trench 137, whereby the conductive layer 151, deposited on the masking film M, may not be thickly connected to the conductive layer 150 located inside the trench 137, and may be formed to be weakly connected or disconnected.

Figure 6D:
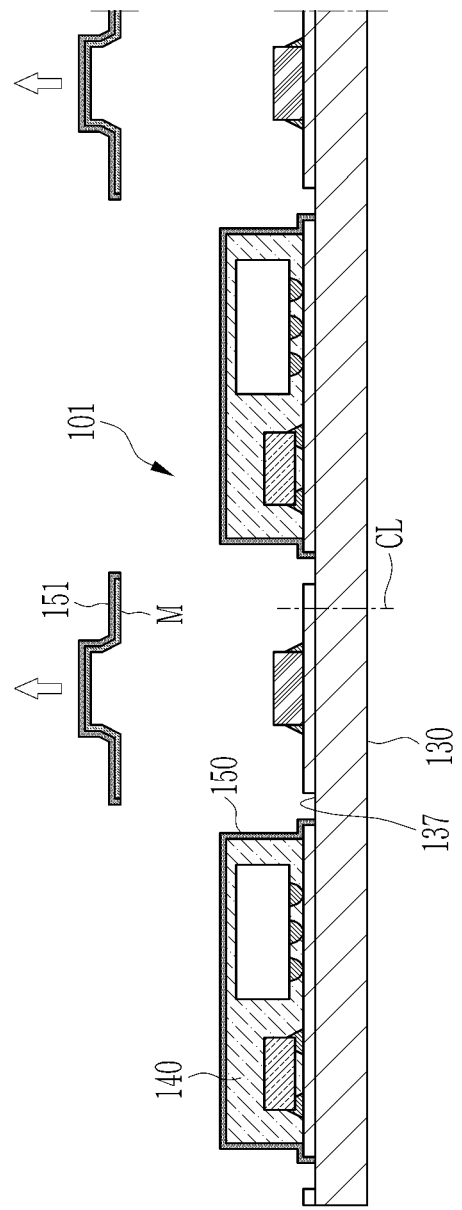

Referring to FIG. 6D, in still another step, the masking film M may be removed. After the deposition of the conductive layers 150 and 151 is completed, the conductive layer 151 deposited on the shield layer non-formation region NS may be removed while removing the masking film M. At this time, the step secured by the trench 137 may disconnect the connection of the conductive layer 150 covering the molded portion 140 and the conductive layer 151 on the masking film M.

Figure 12:
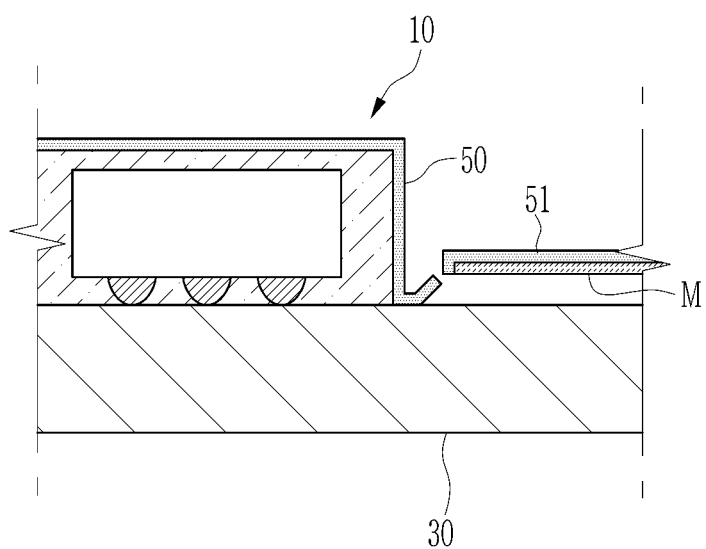
FIG. 12 illustrates a cross-sectional view of an example electronic device package according to an example.

That is, in the example electronic device package according to a comparative example in which the conductive layer is formed without forming a trench on the board, as shown in FIG. 12, since the conductive layer 50 deposited on the board 30, and the conductive layer 51 deposited on the masking film M are thickly connected to each other, the lifting of the conductive layer may occur when the masking film M is removed.

However, in the manufacturing method of the example electronic device package in accordance with the present embodiment, as above-described, as the conductive layer 151 on the masking film M and the conductive layer 150 covering the molded portion 140 may be easily disconnected by the structure of the trench 137 on the board 130, the lifting of the end portion of the conductive layer 150 may be prevented while removing the masking film M.

The array of the electronic device package 100 that the formation of the conductive layer 150 has completed may be cut along the cutting line CL to be manufactured for each module package.

Figure 7:
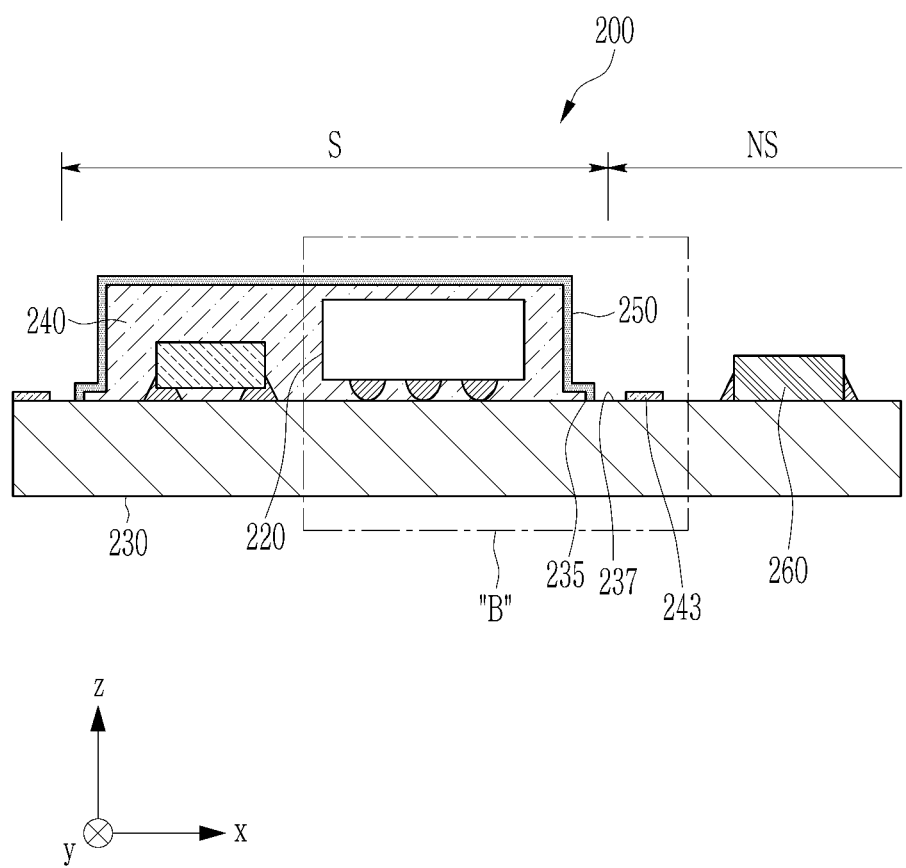
FIG. 7 is a cross-sectional view illustrating an example electronic device package, in accordance with one or more embodiments.
Figure 8:
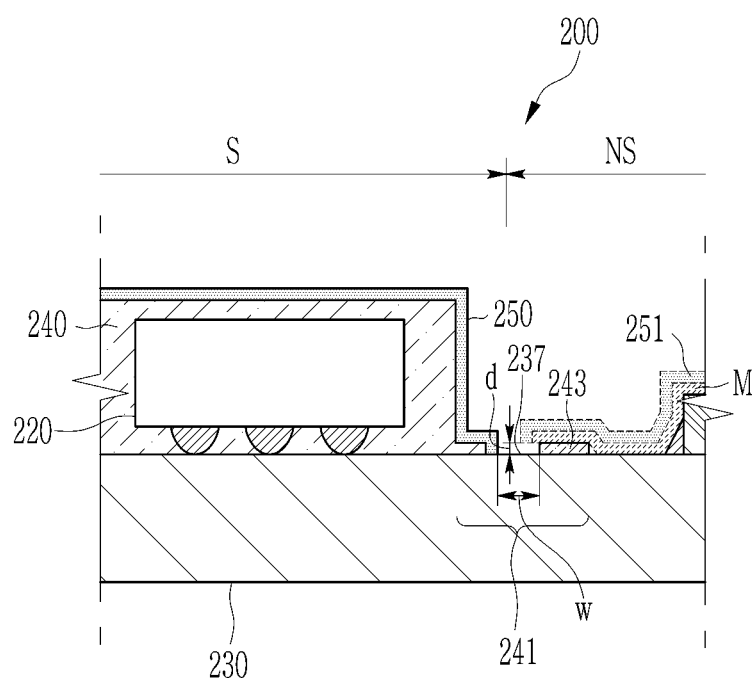
FIG. 8 illustrates an enlarged cross-sectional view of a portion "B", in accordance with one or more embodiments illustrated in FIG. 7.

FIG. 7 is a cross-sectional view illustrating an example electronic device package in accordance with one or more embodiments, and FIG. 8 is an enlarged cross-sectional view of a portion "B" in an example embodiment of FIG. 7.

Referring to FIG. 7, an electronic device package 200, in accordance with one or more embodiments, includes a molded portion 240 that covers a board 230, on which an electronic device 220 is mounted, and an electronic device 220, and a conductive layer 250 may be disposed on the molded portion 240. The electronic device 220 may include an active element such as, as non-limiting examples, an integrated circuit (IC) chip or a passive component. The board 230 may include, as an example, a printed circuit board (PCB).

The molded portion 240 may be formed to cover and seal the electronic device 220 in at least a part of the area above the board 230, and the molded portion 240 may extend to cover the side of the electronic device 220, and meets, or is in contact with, the board 230, thereby being configured to form a border 235. The molded portion 240 may be formed with, for example, an epoxy mold compound (EMC) as a mold material.

The conductive layer 250 may be formed on the molded portion 240 to cover the molded portion 240. The conductive layer 250 may be formed by depositing the conductive material along the surface of the molded portion 240. The conductive layer 250 may be implemented as an electromagnetic interference (EMI) shield layer, and may be deposited by the sputtering process for example.

In the electronic device package 200, a trench 237 may be formed on the board 230 adjacent to the molded portion 240. The trench 237 may be disposed adjacent to the border 235 formed by the meeting or contact of the board 230 and the molded portion 240, and the conductive layer 250 may be disposed to be extended into the trench 237. That is, the conductive layer 250 extended to the side of the molded portion 240 covers the border 235 of the molded portion 240 and the board 230 and then extends into the trench 237, and may reach the bottom of the trench 237.

The trench 237 may be formed by patterning the molded portion 240 on the upper surface of the board 230 adjacent to the border 235. That is, the molded portion 240 may include an extended region 241 extended on the board 230 in a direction perpendicular to the edge thereof, and the trench 237 may be formed by recessing the upper surface of the extended region 241 including the border 235. Therefore, one side wall of the trench 237 may be defined by the molded portion 240 covering the electronic device 220, and the other side wall thereof may be defined by a mold bump 243 that protrudes from the board 230.

Referring to FIG. 8, in an example, the trench 237 may be formed such that the width w is larger than the depth d. In an example, the width of trench 237 may be measured in a direction parallel to the upper surface of board 230 and perpendicular to the edge of the molded portion 240 or the border 235 (the x-axis direction or the y-axis direction in the drawing), and the depth of the trench 237 may be measured in the thickness direction (the z-axis direction in the drawing) of the board 230. Therefore, in the part where the trench 237 extends in the y-axis direction in the drawing, the width w may be measured in the x-axis direction in the drawing, and in the part where the trench 237 extends in the x-axis direction in the drawing, the width w may be in the y-axis direction in the drawing.

The conductive layer 250 may be formed by applying a sputtering process while screening the shield layer non-formation region NS with the masking film M. At this time, as the edge of the masking film M is disposed to protrude over the trench 237 while resting on the top of the mold bump 243, a conductive layer 251 coated to the shield layer formation region S may be easily cut off from the shield layer non-formation region NS with reference to the trench 237 when removing the masking film M. This will be described in more detail with reference to process diagrams following.

Figure 9:
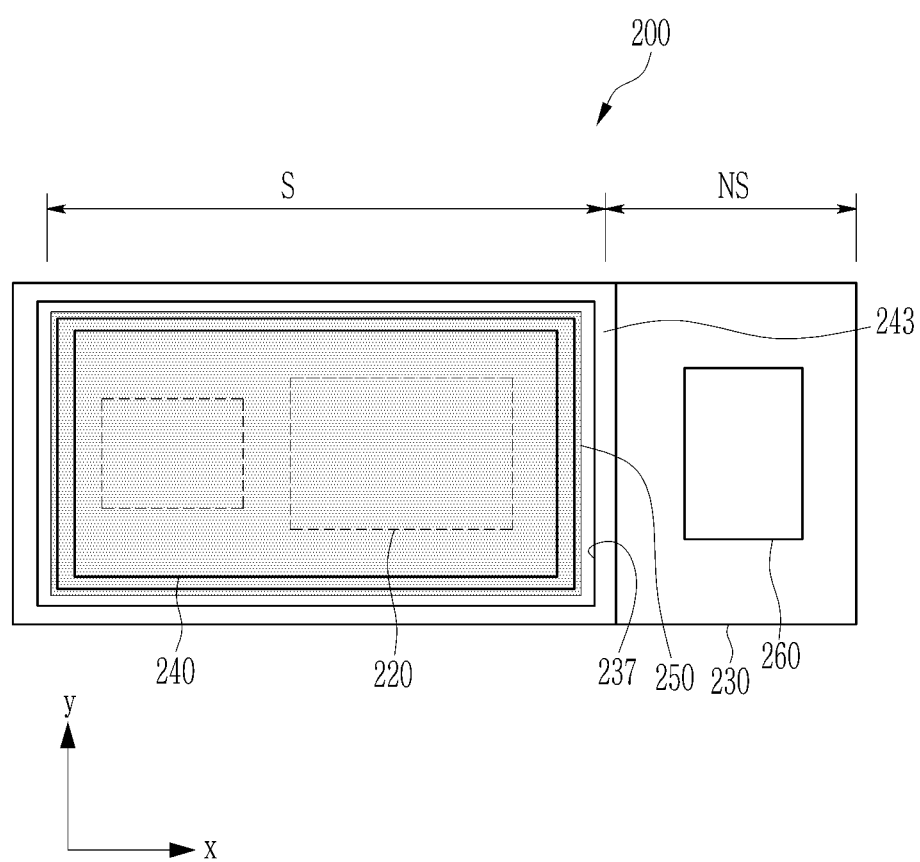
FIG. 9 illustrates a top plan view of an example electronic device package, in accordance with one or more embodiments illustrated in FIG. 7.

FIG. 9 is a top plan view showing an example electronic device package, in accordance one or more embodiments as illustrated in FIG. 7.

Referring to FIG. 9, in the electronic device package 200, the trench 237 may extend side by side along the edge of the molded portion 240, and may be formed to surround the molded portion 240 in the ring shape plane along the outer circumference thereof. Also, another electronic device 260 may be disposed in the shield layer non-formation region NS on the board 230, and for example, a connector may be mounted. Accordingly, the trench 237 may be disposed between the molded portion 240, and another electronic device 260.

In an example, the conductive layer 250, which extends into the trench 237 may be terminated in the trench 237 so that the end portion thereof may be disposed in the trench 237. This is because the conductive layer 250 is disconnected in the trench 237 after the masking film M that protrudes over the trench 237 during the forming process of the conductive layer 250, is removed after the deposition of the conductive layer 250. As a result, the lifting of the conductive layer 250 that may occur on the surface of the board 230 while the conductive layer 250 is deposited using the masking film M may be prevented.

Figure 10:
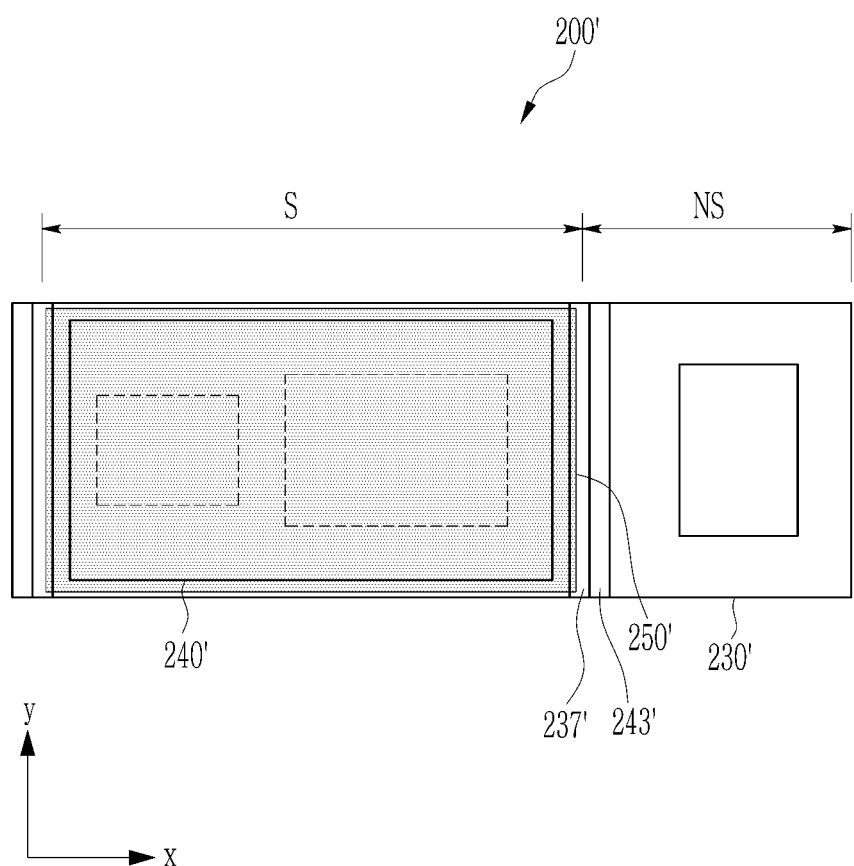
FIG. 10 is a top plan view illustrating an example variation, in accordance with one or more embodiments illustrated in FIG. 7.

FIG. 10 is a top plan view illustrating an example variation of an example embodiment of FIG. 7.

Referring to FIG. 10, in an electronic device package 200' in accordance with an example variation, a trench 237' may extend in a straight line along one edge of a molded portion 240', and may extend to the edge of a board 230'. Therefore, a mold bump 243' that defines the one side wall of the trench 237' may also be extended on a straight line, and may extend to the edge of the board 230'. In an example, the trench 237' may be disposed at two areas on two sides of the molded portion 240' adjacent to the shield layer non-formation region NS on a plane, and the conductive layer 250' may be extended into the trench 237'.

FIG. 11A to FIG. 11D illustrate processing views of a manufacturing process for an example electronic device package in accordance with an embodiment shown in FIG. 7. The manufacturing method of the electronic device package according to the present embodiment will be described with reference to FIG. 11A to FIG. 11D as follows. In an example, the electronic device package may be manufactured by arranging a plurality of modules on the board in the form of an array to produce an electronic device package array 201. The board may then be cut for each single module package.

Figure 11A:
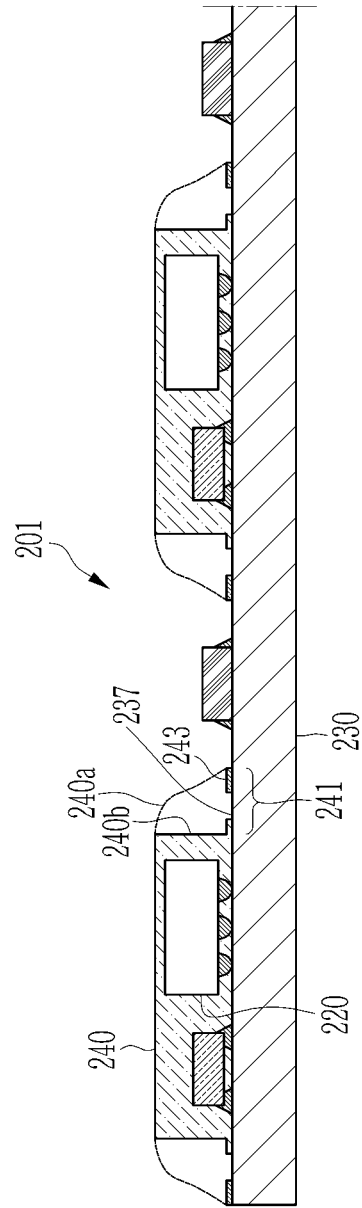

According to the manufacturing method of the electronic device package according to the present example embodiment, in one step, the electronic device 220 may be mounted on the board 230 (referring to FIG. 11A). The board 230 may be implemented as a printed circuit board (PCB), and the electronic device 220 may include active elements such as, but not limited to, IC chips or passive elements.

Referring to FIG. 11A, in another step, the molded portion 240 that seals the electronic device 220, may be formed on the board 230. The molded portion 240 may be formed to cover and seal the electronic device 220 in at least some areas on the board 230. The molded portion 240 thus formed, may be extended to cover the side of the electronic device 220 to contact the board 230. The molded portion 240, for example, may implement an epoxy mold compound (EMC) as a mold material.

Referring to FIG. 11A, in still another step, the trench 237 may be formed on the board 230 adjacent to the molded portion 240 (referring to FIG. 11A). In an example, the trench 237 may be formed by ablation processing the molded portion 240 on the upper surface of the board 230. That is, the molded portion 240 formed to have an inclined surface 240a in a side surface may be cut by using a laser or a saw blade to process a vertical side surface 240b and an extended region 241 extended in a direction intersecting it. Additionally, after forming the trench 237 by ablation processing the upper surface of the extended region 241 to be recessed, a mold bump 243 may be formed outside it.

Figure 11B:
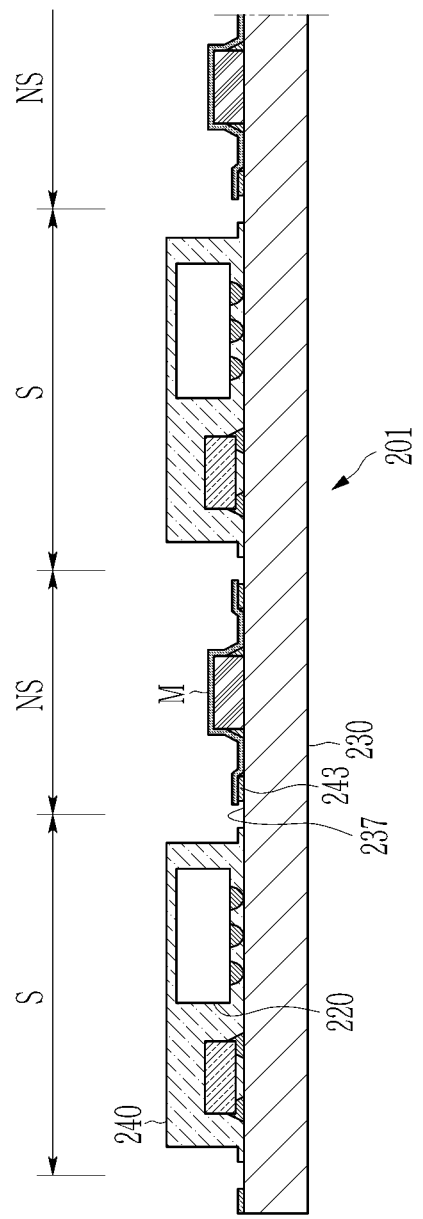

Referring to FIG. 11B, in still another step, the shield layer formation region S that includes the molded portion 240, and the shield layer non-formation region NS, which includes regions other than the shield layer formation region S, may be determined, and the masking film M may be covered in the shield layer non-formation region NS. At this time, one edge of the masking film M may be disposed to protrude over the trench 237 while resting on the upper surface of the mold bump 243.

Referring to FIG. 11C, in still another step, the conductive layers 250 and 251 may be respectively formed over the molded portion 240 and the masking film M. The conductive layer 250 may be formed by depositing a conductive material along the surface of the molded portion 240 so as to function as an electromagnetic interference (EMI) shield layer, and in an example, a sputtering process may be applied. The conductive layer 250 may be formed to cover the molded portion 240, and the conductive layer 251 may be coated on the masking film M, but it may be formed to be easily disconnected in the region of the trench 237.

That is, when the sputtering process is applied, ionized gas atoms of the conductive layer forming material may be ejected and vacuum deposited to form a thin film as a whole on the upper surface of the molded portion 240 and the masking film M. Therefore, the ionized gas atom ejected from the sputtering process may deposit the conductive layer 250 that extends from the top surface and the side surface of the molded portion 240, covers the border of the molded portion 240 and the board 230, and extends to one side interior wall and bottom of the trench 237. In an example, since the masking film M may be disposed so that one edge protrudes over the trench 237, a space formed by the width and the depth of the trench 237 may be secured between the edge of the masking film M and the bottom of the trench 237. While forming a step in this space, the edge of the masking film M may be hung over the trench 237, whereby the conductive layer 251 deposited on the masking film M is not thickly connected to the conductive layer 250 disposed inside the trench 237, but may be weakly connected thereto or formed to be disconnected.

Referring to FIG. 11D, in still another step, the masking film M may be removed. By removing the masking film M after the deposition of the conductive layers 250 and 251 is completed, the conductive layer 251 that is deposited in the shield layer non-formation region NS, may also be removed. At this time, the step secured by the trench 237 cuts off the connection between the conductive layer 251 on the masking film M and the conductive layer 250 covering the molded portion 240, thereby the end portion of the conductive layer deposited on the board 230 may be prevented from lifting while removing the masking film M.

FIG. 12 is a cross-sectional view of an example electronic device package in accordance with a comparative example.

Referring to FIG. 12, a comparative example is an example of an electronic device package 10 in which conductive layers 50 and 51 are formed without forming a trench on a board 30. In the process of forming a partial shield structure, a shield layer non-formation region may be shielded by a masking film and a conductive layer may be formed through a sputtering process. At this time, the conductive layer 50 deposited on the board 30 and the conductive layer 51 deposited on the masking film M may be thickly connected, thereby a sputter burr may occur due to the lifting phenomenon of the conductive layer when the masking film M is removed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An electronic device package, comprising:
an electronic device disposed on a surface of a board;
a molded portion disposed to cover the electronic device; and
a conductive layer, disposed on a surface of the molded portion, and disposed to extend into a trench disposed on the surface of the board,
wherein a bottom surface of the trench disposed in parallel with the surface of the board comprises a first surface covered with the conductive layer and a second surface being a portion of the surface of the board not covered by the conductive layer; and
wherein the board is divided into a shield layer formation region and a shield layer non-formation region, the shield layer non-formation region comprises an electronic device, and the trench is disposed between the molded portion and the electronic device of the shield layer non-formation region.

2. The electronic device package of claim 1, wherein the molded portion is disposed to contact the board to form a border, and the trench is formed adjacent to the border.

3. The electronic device package of claim 1, wherein the trench is disposed to surround the molded portion in a ring shape along an outer circumference of the molded portion.

4. The electronic device package of claim 1, wherein the trench is disposed to extend in a straight line along an edge of the molded portion.

5. The electronic device package of claim 1, wherein an end portion of the conductive layer is disposed within the trench.

6. The electronic device package of claim 1, wherein the trench is formed by recessing an insulating protection layer formed on the surface of the board.

7. The electronic device package of claim 1, wherein the trench is formed by patterning a mold material on the surface of the board.

8. The electronic device package of claim 1, wherein the molded portion comprises an extended region that extends on the board in a direction perpendicular to an edge of the molded portion, and the trench is formed by recessing an upper surface of the extended region of the molded portion.

9. An electronic device package manufacturing method, the method comprising:
mounting an electronic device on a surface of a board;
forming a molded portion that seals the electronic device that is mounted on the board;
forming a trench on the board adjacent to the molded portion;
setting a shield layer non-formation region that is distinguished from a shield layer formation region, wherein the shield layer formation region comprises the molded portion;
forming a masking film on the shield layer non-formation region to dispose an edge of the masking film over the trench;
forming a conductive layer on the molded portion and the masking film; and
removing the masking film,
wherein a bottom portion of the trench disposed in parallel with the surface of the board comprises a first surface covered with the conductive layer and a second surface being a portion of the surface of the board not covered by the conductive layer.

10. The method for manufacturing the electronic device package of claim 9, wherein the forming of the trench comprises patterning an insulating protection layer formed on the surface of the board to form the trench.

11. The electronic device package of claim 2, wherein the trench has a width that is parallel to the surface of the board, and the width is measured in a direction perpendicular to the border, and a depth that is measured in a thickness direction of the board, and the width of the trench is formed to be larger than the depth of the trench.

12. The electronic device package of claim 2, wherein the conductive layer is disposed to extend to a side surface of the molded portion, covers the border, and extends to contact the bottom portion of the trench.

13. The electronic device package of claim 7, wherein a first side wall of the trench is defined by a mold bump that protrudes from the board.

14. The method for manufacturing the electronic device package of claim 9, wherein, in the forming of the trench, a mold material on the surface of the board is patterned to form the trench.

15. An electronic device package, comprising:
- a board, comprising a shield layer formation region, and a shield layer non-formation region;
- a trench, formed on a surface of the board;
- wherein the shield layer formation region comprises:
  - a first electronic device which is covered by a molded portion; and
  - a first conductive layer, disposed on the molded portion, and further disposed to extend into the trench; and
- wherein the shield layer non-formation region comprises:
  - a second electronic device, which is coated with a masking film; and
  - a second conductive layer, disposed over the masking film, and further disposed to extend into the trench,
- wherein a bottom portion of the trench disposed in parallel with the surface of the board comprises a first surface covered with the first conductive layer and a second surface being a portion of the surface of the board not covered by the conductive layer.

16. The electronic device package of claim 15, wherein an edge of the masking film protrudes over the trench.

17. The electronic device package of claim 15, wherein the trench is formed by recessing an insulating protection layer that is formed on the surface of the board.

18. The electronic device package of claim 1, wherein the bottom surface of the trench is disposed on the surface of the board.

19. The electronic device package of claim 1, wherein a depth of the trench, in a thickness direction of the board, is less than a height of the molded portion.

* * * * *